(12) United States Patent
Bruxvoort et al.

(10) Patent No.: US 6,217,984 B1
(45) Date of Patent: *Apr. 17, 2001

(54) ORGANOMETALLIC MONOMERS AND POLYMERS WITH IMPROVED ADHESION

(75) Inventors: Wesley J. Bruxvoort, Woodbury; Steven J. Keipert, Oakdale; Fred B. McCormick, Maplewood; Jerry W. Williams; Bradford B. Wright, both of Cottage Grove, all of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 07/890,593

(22) PCT Filed: May 21, 1992

(86) PCT No.: PCT/US92/04296

§ 371 Date: May 21, 1992

§ 102(e) Date: May 21, 1992

(51) Int. Cl.$^7$ ........................................... B32B 5/00
(52) U.S. Cl. ................... 428/195; 428/323; 428/328; 428/352; 428/412; 428/413; 428/447; 430/270.1; 430/281.1; 430/906; 430/914; 430/916; 522/15; 522/25; 522/66; 528/51; 528/52; 528/56
(58) Field of Search ........................ 428/195, 447, 428/323, 328, 413, 352, 412; 430/270, 281, 283, 288, 906, 914, 916; 522/15, 25, 66; 528/51, 52, 56

(56) References Cited

U.S. PATENT DOCUMENTS

| | | | |
|---|---|---|---|
| 2,958,593 | 11/1960 | Hoover et al. | 51/295 |
| 3,344,111 | 9/1967 | Chalk | 260/46.5 |
| 3,436,666 | 4/1969 | Claytor et al. | 330/5 |
| 3,885,076 | 5/1975 | Heidenreich et al. | 428/195 |
| 4,503,140 | 3/1985 | Wright | 430/289 |
| 4,510,182 | 4/1985 | Cornils et al. | 427/162 |
| 4,985,340 | * 1/1991 | Palazzoto et al. | 430/270 |

FOREIGN PATENT DOCUMENTS

| | | | |
|---|---|---|---|
| 0 095 269 A3 | 11/1983 | (EP) | G03F/7/10 |
| 0 321 230 A3 | 6/1989 | (EP) | B24D/3/00 |
| 0 396 150 A2 | 11/1990 | (EP) | B24D/11/00 |
| 1 463 816 | 2/1977 | (GB) . | |
| 2 106 522 | 4/1983 | (GB) | C08K/3/18 |

OTHER PUBLICATIONS

Streitwieser et al, "Introduction to Organic Chemistry" 3rd Ed. Macmillan Publ., 1985 p. 1103.*
Coombs "Printed Circuits Handbook" 3rd. Ed. McGrow Hill pp. 11.25–11.29, (1989).*
Bennet, "Concise Chemical and Technical Dictionary" 4th Ed., p. 840.*
Bailey et al., "Immobilized Transition–Metal Carbonyls & Related Catalysts", Chemical Reviews, 1981, vol. 81, No. 2, pp. 109–111, 116–123, 132–145.*
Mittal, K.L., "Adhesion Measurement of Thin Films, Thick Films & Bulk Coatings", 1978 pp. 5–17.
Plueddemann, "Adhesion", 1970, 2, 184.
Ahagon et al., "J. Polymer Science", Polymer Physics Ed., 1975, 13, 1285.
Arkles, Chemtech, 1977, 7, 766.
Pittman, "Organic Polymer Containing Transition Metals", Chem. Tech., 1971, 416.
George et al., Thin Solid Films, 1980, 67, L25.
Seyferth et al., "Inorganic & Organometallic Polymers" ACS Symp. Ser., Zeldin et al. Eds., 1988, 143–55.
Carraher, Chem. Tech., 1972, 741.
Frisch & Reegan, "Ring–Opening Polymerizations"; Marcel Dekker, Inc.: New York, 1969, vol. 2.
Lee & Neville, "Handbook of Epoxy Resins"; McGraw Hill Book Co. : New York, 1967; Appendix A.
Bruins, "Epoxy Resin Technology"; John Wiley & Sons: New York, 1968.
Kuirmura et al., Makromol. Chem., 1982, 183, 2889.
Pittman et al., "Macromolecules", 1973, 6, 1.
Gowal et al., Monatshefte fur Chemie, 1968, 99, 972.
Pittman et al., J. Polymer Sci., Part A–1, 1972, 10, 379.
Giordano and Wrighton, Inorganic Chemistry, 1977, vol. 16, 160.

* cited by examiner

Primary Examiner—William Krynski
(74) Attorney, Agent, or Firm—Carolyn V. Peters

(57) ABSTRACT

An energy sensitive composition comprising a monomeric organometallic complex essentially free of nucleophilic groups and which, upon exposure to energy, bonds to basic reactive sites on a substrate via the metal center, leaving the polymerizable group of the complex unreacted and unrestricted; an energy sensitive composition at least one energy sensitive organometallic group is incorporated in or appended to the backbone of a polymer, such that the resulting coordinatively unsaturated organometallic group or groups bond to basic reactive sites on a substrate, thus forming permanent bonds, and further, the adherent compositions are useful in applications such as adhesion of polymers to substrates, protective coatings, printing plates, durable release coatings, primers, binders, and paints.

20 Claims, No Drawings

ORGANOMETALLIC MONOMERS AND POLYMERS WITH IMPROVED ADHESION

TECHNICAL FIELD

This invention relates to organometallic complex-containing monomers and polymers, and to their uses as adhesive primers, protective coatings, and release coatings in both imaged and non-imaged applications.

BACKGROUND OF THE INVENTION

Coatings of polymeric materials on various substrates are of industrial significance and provide the basis for a number of products. It is generally recognized that adhesion of polymeric coatings to substrates is critically important in determining the properties and performance characteristics of a coated article. Unfortunately, the nature of adhesion between a polymeric coating and a substrate tends to be complex and often difficult to test, study, or control (*Adhesion Measurement of Thin Films, Thick Films and Bulk Coatings*; Mittal, K. L., Ed.; 1978, pp 5–17).

One accepted method of improving the adhesion of polymers to inorganic substrates is to use silane coupling agents that contain groups reacting with inorganic surfaces as well as groups that react with the polymeric coating, Pluedde-mann *J. Adhesion* 1970, 2, 184. For example, the improved adhesion of crosslinked polybutadiene coated on glass plates treated with vinyltriethoxysilane compared to glass plates treated with ethyltriethoxysilane is illustrative of this effect, Ahagon et al. *J. Polymer Science, Polymer Physics Edition* 1975, 13, 1285. However, chemical application of silane coupling agents to various substrates tends to be a complex process that often requires a heat curing step. Further, it is generally difficult to limit the application of these coupling agents to selected areas of substrate, Arkles *Chemtech* 1977, 7, 766.

U.S. Pat. No. 4,503,140 describes photocurable coatings comprising organic polymers containing transition metal carbonyl species useful for printing plate formulations. The radiation cured coatings were crosslinked through polymer bound nucleophilic groups to form insoluble crosslinked resins. A wide variety of substrates are described as suitable for the coatings, including wood, paper, organic polymers, glass, ceramics, and metals.

U.K. Patent No. 1,463,816 describes organometallic metal carbonyl compounds useful for photocrosslinking of halogen containing polymers. Benzenechromium tricarbonyl and related metal carbonyl complexes photocrosslink polymers carrying a variety of nucleophilic groups. Oxygen was required for the crosslinking to proceed. The feasibility of binding organometallic polymers to a variety of surfaces has been questioned, Pittman *Chem. Tech.* 1971, 416.

Organometallic compounds have been used in chemical vapor deposition (CVD) processes to prepare films of metals, metal carbides, metalloids, ceramics, and the like. In general, the organic ligands of the organometallic precursor are lost in the CVD process as, for example, in the deposition of molybdenum/manganese alloy films from gaseous cyclopentadienylmolybdenum tricarbonyl manganese pentacarbonyl as described in U.S. Pat. No. 4,510,182. In some cases, organic groups may be retained in the bulk of the deposited films as, for example, in the photoelectrochemical decomposition of methylcyclopentadienylmanganese tricarbonyl onto soda-lime glass surfaces to leave a manganese film that was nonconducting due to incorporation of the cyclopentadienyl ligand, George et al. *Thin Solid Films* 1980, 67, L25. Precursor molecules in a CVD process must be sufficiently volatile to allow transport of their vapors to the substrate. Polymeric organometallic species, due to their high molecular weight and nonvolatile nature, are generally not suitable for film formation by CVD processes.

Pyrolysis of organometallic polymers, especially those incorporating main group metals or metalloids, has led to useful ceramic materials. For example, coatings of polysilazanes have been converted to silicon nitride ceramics (Seyferth et al. *Inorganic and Organometallic Polymers, ACS Symposium Series*; Zeldin et al. Eds.; 1988, pp 143–55) and organometallic polyesters of titanium have been pyrolyzed to $TiO_2$ (Carraher *Chem. Tech.* 1972, 741). However, high temperatures are required for those transformations.

Organometallic complexes have been used to attach transition metal species to a variety of surface groups on inorganic supports for use as heterogeneous catalysts. Several mechanisms have been proposed for this reactivity. For example, catalytically important ruthenium tricarbonyl groups are thought to be attached to magnesium oxide supports by two Ru—O—Mg bonds and one MgOH—Ru bond. Cyclopentadienylmanganese tricarbonyl derivatives have been intercalated into a zirconium hydrogen phosphate host by a photolytic reaction.

Many organic polymers that incorporate transition metal carbonyl species by covalent bonds are known in the art. These polymers often have unique properties intermediate between those of metals and organic polymers.

In general, the transition metal containing organic polymers are prepared by copolymerization of organic monomers with organometallic monomers. Functionalization of preformed polymers by reaction with organometallic compounds to yield transition metal containing organic polymers is less well known. Vinyl ferrocenes have been hydrosilylated with polyalkylhydrosiloxanes to give siloxane polymers with pendent ferrocene groups. However, the method has not been demonstrated for transition metal carbonyl compounds. Reaction of chromium hexacarbonyl with preformed polystyrene has been demonstrated as a means of preparing copolymers of styrene and (styrene) chromiumtricarbonyl.

SUMMARY OF THE INVENTION

Briefly, one aspect of this invention provides an energy sensitive composition comprising a monomeric organometallic complex essentially free of nucleophilic groups and which, upon exposure to energy, bonds to basic reactive sites on a substrate via the metal center, leaving the polymerizable group of the complex unreacted and unrestricted. The energy sensitive compositions have utility as primers and coupling agents.

In another aspect of the present invention at least one energy sensitive organometallic group is incorporated in or appended to the backbone of a polymer. Upon exposure to energy, one or more ligands are lost from at least one organometallic group. The resulting coordinatively unsaturated organometallic group or groups bond to basic reactive sites on a substrate, thus forming permanent bonds. The resultant adherent compositions are useful in applications such as adhesion of polymers to substrates, protective coatings, printing plates, durable release coatings, primers, binders, and paints.

Another aspect of the present invention provides for an energy sensitive article comprising (1) a substrate having basic reactive sites; and (2) an energy sensitive organometallic compound coated on at least a portion of at least one surface of the substrate and adhered (upon exposure to energy) to the substrate through an organometallic group in the organometallic compound, wherein the organometallic compound is essentially free of nucleophilic groups. The organometallic compound can either be a monomeric organometallic complex, or a homopolymer or copolymer comprising at least one energy sensitive organometallic group incorporated in or appended to the backbone of the polymer.

In a further aspect, this invention provides a method for preparing organometallic polymer compositions by derivatization of organic polymers. While not intending to be bound by theory, it is believed the organometallic polymers are prepared by the modification of organic polymers through the reaction of functional group substituted organometallic complexes with functional group substituted organic polymers.

Advantages of the present energy sensitive compositions include (i) increased adhesion of polymeric coatings to substrates by chemical bonding of the coating to the substrate, (ii) simplified compositions over the art as no crosslinking groups, catalysts, or additives are required for adhesion, (iii) physical properties of the polymeric coatings are not substantially affected as crosslinking is not required, (iv) previously unknown organometallic siloxane and fluorocarbon polymers are now available to provide durable coatings of high hydrophobicity, and (v) durable, low surface energy coatings. Low surface energy is particularly useful as metal molds coatings, release coatings, release liners, and other "non-stick" coating applications.

Advantageously, the present invention does not rely on halogen abstraction to effect crosslinking or adhesion to a substrate, nor does the present invention require nucleophilic crosslinking agents. Further advantages of the present invention include (i) improvement of coating adhesion through radiant energy, thus avoiding high temperature curing, and associated degradation of the polymer and/or substrate, and (ii) imagewise bonding of the polymeric coating to selected areas of the substrate.

What the art has not shown, that this invention teaches, is that transition metal carbonyl containing polymers and monomers, upon application of energy, adhere to various basic metal oxide surfaces. Many metallic substrates, including silver, do not show evidence of adhesion, as these metals generally lack basic metal oxide surfaces. Preferably, the entire process is effectively carried out under nitrogen, thereby reducing potential oxidative coupling reactions involving atmospheric oxygen. A feature of this invention is the lack of reliance on nucleophilic crosslinking of the energy sensitive polymer films to produce adherent coatings.

Furthermore, adhesion to substrates by covalent bonding of a transition metal organometallic group of a polymer to basic reactive sites on the substrate in either patterned or unpatterned fashions is not taught. Nor does the art teach transition metal organometallic compounds useful as coupling agents for polymeric coatings or matrix resins. The art does not teach utility as primers, coupling agents, release coatings, printing plates, and the like of polymeric coatings adhered to substrates by method of covalent bonding of a transition metal organometallic group to the substrate.

In this application:

"organometallic group" means a chemical substance in which at least one carbon of an organic moiety is bonded to a transition metal atom;

"organometallic compound" means a monomeric organometallic complex, or a homopolymer or copolymer comprising at least one energy sensitive organometallic group is incorporated in or appended to the backbone of the polymer;

"organometallic polymer" means an organic polymer wherein organometallic groups have been incorporated into or appended onto the backbone of the organic polymer by a covalent bond;

"energy sensitive" means able to undergo chemical reaction or transformation upon exposure to electromagnetic radiation (for example, ultraviolet, infrared, and visible), accelerated particles (electron beam), and thermal (infrared and heat) energy;

"actinic radiation" means radiation that causes a chemical change, and includes electromagnetic radiation (for example, ultraviolet, infrared, and visible), accelerated particles (electron beams), and thermal (infrared and heat) energy;

"cyclopolyenyl" means a cyclopentadienyl group or a benzene group, wherein the groups may be substituted or unsubstituted;

"nucleophilic group" means an organic group that will displace tetrahydrofuran from (cyclopentadienyl)(tetrahydrofuran)dicarbonylmanganese in solution in tetrahydrofuran at about 25° C. under nitrogen in less than one hour;

"film-forming" means capable of forming a continuous, coherent coating;

"basic reactive site" means an exposed site on a substrate surface having basic functionality such that an aqueous slurry of the substrate may be titrated with a strong acid with consumption of acid above pH 7 furthermore, acidic functionality may also be present on the substrate surface in combination with basic functionality;

"conjugated polyolefin-π-bonded metal complex" also referred to as "conjugated organometallic compounds" means a linear or cyclic conjugated polyolefinic ligand bonded to a transition metal by metal to carbon covalent bonds such that the polyolefinic ligand donates from 3 to 9 electrons to the valence shell of the transition metal atom, and further contains sufficient additional ligands such that a stable valence electron configuration of 18 is attained by the transition metal atom;

"ethylenically unsaturated group substituted conjugated polyolefin-π-bonded metal complexes" also referred to as "ethylenically unsaturated organometallic compounds" means conjugated polyolefin-π-bonded metal complexes as defined above wherein the polyolefinic ligand is further substituted via covalent linkages with an ethylenically unsaturated group;

"polyol group substituted conjugated polyolefin-π-bonded metal complexes" also referred to as "polyol organometallic compounds" means conjugated polyolefin-π-bonded metal complexes as defined above wherein the polyolefinic ligand is further substituted via covalent linkages with a polyol group;

"epoxy group substituted conjugated polyolefin-π-bonded metal complexes" also referred to as "epoxy organometallic compounds" means conjugated polyolefin-π-bonded metal complexes as defined above wherein the polyolefinic ligand is further substituted via covalent linkages with an epoxy group; and "functional group substituted conjugated polyolefin-π-bonded metal complexes" also referred to as "functionalized organometallic compounds" means conjugated polyolefin-π-bonded metal complexes as defined above wherein the polyolefinic ligand is further substituted via covalent linkages with an organic group capable of further reactivity.

DESCRIPTION OF THE PREFERRED EMBODIMENT(S)

In a preferred embodiment, this invention provides an energy sensitive film-forming organometallic compound coated on a substrate that has basic reactive sites on at least a portion of at least one major surface of the substrate. Upon exposure to electromagnetic radiation, accelerated particles and/or thermal energy, the organometallic compound is bonded or adhered to the surface of the substrate. The resulting coating does not rely on crosslinking of the polymeric coating to generate adhesive forces.

Further, in another embodiment of this invention monomeric organometallic compounds that, when coated on a reactive substrate and exposed to heat or actinic radiation, firmly adhere the monomeric species to the substrate.

In a further embodiment, this invention provides methods of preparing novel organometallic polymers by the chemical modification of organic polymers. The organometallic polymers may be copolymers comprising at least one monomeric unit of a transition metal-containing monomer, the monomer containing at least one metal to carbon bond. For example, such copolymers include polymers derived from (1) ethylenically unsaturated group substituted conjugated polyolefin-π-bonded metal complexes and ethylenically unsaturated organic monomers;

(2) polyol group substituted conjugated polyolefin-π-bonded metal complexes and polyisocyanates, or a mixture of polyisocyanates and polyols; or (3) epoxy group substituted conjugated polyolefin-π-bonded metal complexes and epoxy containing organic monomers.

The organometallic polymers may also be functional group containing organic polymers that have been derivatized with functional group substituted conjugated polyolefin-π-bonded metal complexes.

Illustrative examples of ethylenically unsaturated group substituted conjugated polyolefin-π-bonded metal complexes include the following: (vinylcyclopentadienyl) tricarbonylmanganese, (1-vinyl-2-methylcyclopentadienyl) tricarbonylmanganese, (1-vinyl-3-methylcyclopentadienyl) tricarbonylmanganese, (vinylcyclopentadienyl) tricarbonylrhenium, (1-vinyl-2-methylcyclopentadienyl) tricarbonylrhenium, (1-vinyl-3-methylcyclopentadienyl) tricarbonylrhenium, (acryloylcyclopentadienyl) tricarbonylmanganese, (methacryloylcyclopentadienyl) tricarbonylmanganese, (1-acryloyl-2-methylcyclopentadienyl)tricarbonylmanganese, (1-acryloyl-3-methylcyclopentadienyl)tricarbonylmanganese, (styrene) tricarbonylchromium, (styrene)tricarbonylmolybdenum, (styrene)tricarbonyltungsten, 1-[(3-methylcyclopentadienyl)tricarbonylmanganese]ethyl acrylate, 1-[(2-methylcyclopentadienyl) tricarbonylmanganese]ethyl acrylate, 1-[(cyclopentadienyl) tricarbonylmanganese]ethyl acrylate, (vinylcyclopentadienyl)dicarbonylnitrosylchromium, (vinylcyclopentadienyl)dicarbonylnitrosylmolybdenum, (vinylcyclopentadienyl)dicarbonylnitrosyltungsten, (1-acryloylhexa-2,4-diene)tricarbonyliron, (1-acryloylcyclohexa-2,4-diene)tricarbonyliron, (1-acryloylhexa-2,4-dienyl)tricarbonyliron(+1) hexafluorophosphate, (benzyl acrylate) tricarbonylchromium, (2-phenethyl acrylate) tricarbonylchromium, (vinylcyclopentadienyl) tricarbonylmethyltungsten, (acryloyloxymethylcyclopentadienyl) tricarbonylmethyltungsten, (2-phenethyl methacrylate) tricarbonylchromium, (vinylcyclopentadienyl) trichlorotitanium, (vinylcyclopentadienyl) (cyclopentadienyl)dichlorotitanium, (vinylcyclopentadienyl)dicarbonylcobalt, (vinylcyclopentadienyl)dicarbonylrhodium, (vinylcyclopentadienyl)dicarbonyliridium, (vinylcyclopentadienyl)tricarbonyliron(+1) hexafluorophosphate, (vinylcyclopentadienyl)(mesitylene) iron(+1)hexafluoroantimonate, (1-vinyl-2-methylcyclopentadienyl)dicarbonylnitrosylmanganese(+1) tetrafluoroborate, (1-vinyl-3-methylcyclopentadienyl) dicarbonylnitrosylmanganese(+1) tetrafluoroborate, (styrene)tricarbonylmanganese(+1)hexafluoroarsenate, and (vinylcyclopentadienyl)(toluene)iron(+1)tetraphenylborate.

Film-forming, energy sensitive, conjugated polyolefin-π-bonded metal complex containing polymers of this invention are prepared by addition polymerization of 0.1 to 100 percent by weight of ethylenically unsaturated group substituted conjugated polyolefin-π-bonded metal complexes together with 0 to 99.9 percent by weight of other addition polymerizable monomers. Preferably, the metal complex comprises 0.5 to 70 percent by weight, and more preferably 1 to 20 percent by weight of the polymer.

The organometallic group may be incorporated into a polymer by copolymerization of a functional group substituted conjugated polyolefin-π-bonded metal complex with an organic monomer or oligomer. Non-limiting examples prepared using this approach include copolymerization of acrylate or methacrylate functionalized organometallic compounds with acrylates, methacrylates, and other monomers known to copolymerize with acrylates by a free-radical mechanism; copolymerization of epoxy (for example, glycidyl ether) functionalized organometallic compounds with epoxy monomers to form polyethers, cyclic anhydride monomers to form polyesters, and other monomers capable of forming polymers by copolymerization with epoxy monomers; copolymerization of alkenyl functionalized organometallic compounds, such as for example, vinylcyclopentadienyl anion or styryl with alkenyl monomers such as styrene, isobutylene, etc.; copolymerization of diol functionalized organometallic compounds with diisocyanates to form polyurethanes. Polymers formed by this method may have organometallic functional groups pendent from the polymer backbone or incorporated directly into the polymer backbone.

Generally, free-radical polymerization can be performed by agitation of a solution of the ethylenically unsaturated group substituted conjugated polyolefin-π-bonded metal complexes with other monomers in an inert deoxygenated solvent at a temperature of about 50° to 150° C. for about 5 to about 50 hours or more in the presence of 0.1 to 10 weight percent of an initiator, the solution being made to contain 10 to 75 percent by weight of total monomers. Preferably, the initiator is a free radical initiator such as azobis(isobutyro) nitrile (AIBN).

Additional description of the polymerization and copolymerization of ethylenically unsaturated group substituted conjugated polyolefin-π-bonded metal complexes can be found in the previously cited reference to Pittman et al.

Ethylenically unsaturated monomers that may be copolymerized with ethylenically unsaturated group substituted polyolefin-π-bonded metal complexes to provide the organometallic polymers include any ethylenically unsaturated monomeric or polymeric compound or mixture thereof. Since it is desirable that the organometallic polymer be soluble in common solvents to facilitate coating procedures, there should be less than about one percent by weight of polyethylenic unsaturation in the monomers.

Illustrative examples of suitable monomers for copolymerization with organometallic ethylenically unsaturated monomers, include vinyl, allylic, acrylic, and methacrylic compounds such as the esters of unsaturated monocarboxylic acids or diacids, e.g., esters of acrylic acid, methacrylic acid, α-cyanoacrylic acid, crotonic acid, cinnamic acid, sorbic acid, maleic acid, fumaric acid, or itaconic acid with aliphatic, cycloaliphatic, or aromatic alcohols of 1 to 20 carbon atoms, such as methyl acrylate and methacrylate, n-, iso-, and t-butyl acrylate and methacrylate, 2-ethylhexyl acrylate, lauryl acrylate, tetrahydrocyclopentadienyl acrylate and methacrylate, hydroxyethyl acrylate and methacrylate, ethyl α-cyanoacrylate, ethyl crotonate, ethyl sorbate, diethyl maleate, and dimethyl fumarate; the amides of acrylic or methacrylic acid, e.g., N,N-dimethylacrylamide, N-isobutylacrylamide, diacetoneacrylamide, N-methoxymethylacrylamide, N-butoxymethylmethacrylamide and N-phenylmethacrylamide; vinyl esters of monocarboxylic acids, e.g., vinyl acetate, vinyl propionate, vinyl 2-ethylhexanoate, and vinyl stearate; non-basic mono-N-vinyl compounds, e.g., N-vinylpyrrolidone, N-vinylpiperidone, N-vinylcaprolactam, N-vinyloxazolidone, N-vinylsuccinimide, N-methyl-N-vinylformamide, and N-vinylcarbazole; and vinyl ethers of monohydric alcohols of 1 to 20 carbon atoms, e.g., methyl vinyl ether, isobutyl vinyl ether, n-hexyl vinyl ether, and octadecyl vinyl ether.

Polymers of this invention may also be prepared by condensation polymerization of polyol group substituted polyolefin-π-bonded metal complexes with polyisocyanates and optionally, polyols to provide polyurethanes, or with polyacids or polyacid halides, and optionally, polyols to provide polyesters. Furthermore, the polyol group substituted polyolefin-π-bonded metal complexes can be reacted into phenol-formaldehyde resins in a condensation reaction.

Alternatively, the organometallic group may be incorporated into a polymer by coupling a reactive group attached to the organometallic compound with another reactive group attached to a pre-existing polymer. Non-limiting examples of this approach include coupling reactions known in the chemical arts such as the reaction of alcohols and isocyanates to form a urethane linkage; alcohols and epoxies to form a β-hydroxy ether linkage; Diels-Alder coupling of a diene and an alkene to form a cyclohexene linkage, hydrosilation of an alkene with a hydrosilane to form a silane linkage; reaction of a siloxane with an alcohol to form a siloxane linkage; acylation of an alcohol, thiol, or amine with an acylating agent such as an acid halide; reaction of an alcohol with a phenol-formaldehyde resins; and so forth. In the above examples, any reactive group may be present on the organometallic compound provided that a corresponding reactive group is present on the polymer.

Illustrative examples of polyol group substituted polyolefin-π-bonded metal complexes include [1-(2',3'-dihydroxy-n-propoxycarbonyl)-2-methylcyclopentadienyl]tricarbonylmanganese, [1-(2',3'-dihydroxy-n-propoxycarbonyl)-3-methylcyclopentadienyl]tricarbonylmanganese, [2,3-dihydroxy-n-propoxycarbonyl)cyclopentadienyl]tricarbonylmanganese, [1-(1',3'-dihydroxy-iso-propoxycarbonyl)-2-methylcyclopentadienyl]tricarbonylmanganese, [1-(1',3'-dihydroxy-iso-propoxycarbonyl)-3-methylcyclopentadienyl]tricarbonylmanganese, [2,3-dihydroxy-iso-propoxycarbonyl)cyclopentadienyl]tricarbonylmanganese, [2,3-dihydroxy-n-propoxycarbonyl)benzene]tricarbonylchromium, [2,3-dihydroxy-iso-propoxycarbonyl)benzene]tricarbonylchromium, [1-(1',2'-dihydroxyethyl)-2-methylcyclopentadienyl]tricarbonylmanganese, [1-(1',2'-dihydroxyethyl)-3-methylcyclopentadienyl]tricarbonylmanganese, [(1,2-dihydroxyethyl)cyclopentadienyl]tricarbonylmanganese, [3-α-(2'-methylcyclopentadienyl)ethoxy-1,2-propanediol]tricarbonylmanganese, [3-α-(3'-methylcyclopentadienyl)ethoxy-1,2-propanediol]tricarbonylmanganese, and [3-α-(cyclopentadienyl)ethoxy-1,2-propanediol]tricarbonylmanganese.

The polyisocyanate component of the polyurethane precursors useful in practicing the present invention may be any aliphatic, cycloaliphatic, araliphatic, aromatic, or heterocyclic polyisocyanate, or any combination of such polyisocyanates.

Particularly suitable polyisocyanates correspond to the formula

$$Q(NCO)_2 \qquad (I)$$

in which Q represents an aliphatic hydrocarbon di-radical containing from 2 to 100 carbon atoms, and zero to 50 heteroatoms, a cycloaliphatic hydrocarbon radical containing from 4 to 100 carbon atoms and zero to 50 heteroatoms, an aromatic hydrocarbon radical or heterocyclic aromatic radical containing from 5 to 15 carbon atoms and zero to 10 heteroatoms, or an araliphatic hydrocarbon radical containing from 8 to 100 carbon atoms and zero to 50 heteroatoms. The heteroatoms that can be present in Q include non-peroxidic oxygen, sulfur, non-amino nitrogen, halogen, silicon, and non-phosphino phosphorus.

Nonlimiting examples of polyisocyanates include those described in Frisch, K. *New Advances in the Chemistry and Technology of Urethane and Other Isocyanate Based Polymers*, Technomic Publishing Co., 1985 such as: ethylene diisocyanate, 1,4-tetramethylene diisocyanate, 1,6-hexamethylene diisocyanate, trimethylhexamethylene diisocyanate, 1,12-dodecane diisocyanate, cyclobutane-1,3-diisocyanate, cyclohexane-1,3- and -1,4-diisocyanate and mixtures of these isomers, 1-isocyanate-3,3,5-trimethyl-5-isocyanatomethyl cyclohexane, 2,4- and 2,6-hexahydrotolylene diisocyanate and mixtures of these isomers, hexahydro-1,3- and/or -1,4-phenylene diisocyanate, perhydro-2,4,-and/or -4,4'-diphenylmethane diisocyanate, 1,3- and 1,4-phenylene diisocyanate, 2,4- and 2,6-tolylene diisocyanate and mixtures of these isomers, diphenylmethane-2,4'- and/or -4,4'-diisocyanate, naphthylene-1,5-diisocyanate, and the reaction products of four equivalents of the aforementioned isocyanate-containing compounds with compounds containing two isocyanate-reactive groups.

According to the present invention, it is also possible for example, to use triphenylmethane-4,4',4"-triisocyanate, polyphenyl polymethylene polyisocyanates, m- and p-isocyanatophenyl sulphonyl isocyanates, perchlorinated aryl polyisocyanates, polyisocyanates containing carbodimide groups, norbornane diisocyanates, polyisocyanates containing allophanate groups, polyisocyanates containing isocyanurate groups, polyisocyanates containing urethane groups, polyisocyanates containing acrylate urea groups, polyisocyanates containing biuret groups, polyisocyanates produced by telomerization reactions, polyisocyanates containing ester groups, reaction products of the above-mentioned diisocyanates with acetals, and polyisocyanates containing polymeric fatty acid esters.

It is also possible to use distillation residues having isocyanate groups obtained in the commercial production of isocyanates, optionally in solution in one or more of the above-mentioned polyisocyanates. It is also possible to use any mixtures of the above-mentioned polyisocyanates.

For the polyol component of the polyurethane, it is particularly advantageous to combine low-melting and high-melting polyhydroxyl containing compounds with one another. Low molecular weight compounds containing at least two hydroxy groups suitable for use in accordance with the present invention are compounds preferably containing 2 to 8 hydroxy groups and more preferably 2 hydroxy groups. Nonlimiting examples of such compounds include ethylene glycol, 1,2- and 1,3- propylene glycol, 1,4- and 2,3-butylene glycol, 1,5-pentanediol, 1,8-octanediol, neopentyl glycol, 1,4-bis(hydroxymethyl)cyclohexane, 2-methyl-1,3-propanediol, dibromobutenediol, glycerol, trimethylolpropane, 1,2,6-hexanetriol, trimethylolethane, pentaerythritol, quinitol, mannitol, sorbitol, diethylene glycol, triethylene glycol, tetraethylene glycol, higher polyethylene glycols, dipropylene glycol, higher polypropylene glycols, dibutylene glycol, higher polybutylene glycols, 4,4-dihydroxydiphenylpropane and dihydroxymethylhydroquinone.

Other polyols suitable for the purposes of the present invention are the mixtures of hydroxyaldehydes and hydroxyketones (for example, formose) or the polyhydric alcohols obtained therefrom by reduction (for example, formitol) that are formed in autocondensation of formaldehyde hydrate in the presence of metal compounds as catalysts and compounds capable of enediol formation as co-catalysts. Solutions of polyisocyanate polyaddition products, particularly solutions of polyurethane ureas containing ionic groups and/or solutions of polyhydrazodicarbonamides, in low molecular weight polyhydric alcohols may also be used as the polyol component in accordance with the present invention.

Additionally, the polymers of the present invention may be prepared by addition polymerization of epoxy group substituted polyolefin-π-bonded metal complexes with epoxy monomers to provide polyethers.

Illustrative examples of epoxy group substituted polyolefin-π-bonded metal complexes include [(1'-glycidoxyethyl)-2-methyl-cyclopentadienyl]tricarbonylmanganese, [(1'-glycidoxyethyl)-3-methylcyclopentadienyl]tricarbonylmanganese, (1'-glycidoxyethyl)cyclopentadienyltricarbonylmanganese, (1',2'-epoxyethyl)-2-methylcyclopentadienyltricarbonylmanganese, (1',2'-epoxyethyl)-3-methylcyclopentadienyltricarbonylmanganese, and 1,2-epoxyethylcyclopentadienyltricarbonylmanganese.

The epoxy compounds that may be copolymerized in the present invention are 1,2-cyclic ethers and include those described in Frisch and Reegan *Ring-Opening Polymerizations*; Marcel Dekker, Inc.: New York, 1969; Vol. 2. Suitable 1,2-cyclic ethers are the monomeric and polymeric types of epoxides. They can be aliphatic, cycloaliphatic, aromatic, or heterocyclic and will typically have an epoxy equivalency of from 1 to 6, preferably 1 to 3. Particularly useful are the aliphatic, cycloaliphatic, and glycidyl ether type 1,2-epoxides such as propylene oxide, epichlorohydrin, styrene oxide, vinylcyclohexene oxide, cyclohexene oxide, glycidyl methacrylate, diglycidyl ether of bisphenol A, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, bis(3,4-epoxy-6-methylcyclohexylmethyl)adipate, dicyclopentadiene dioxide, epoxidized polybutadiene, 1,4-butanediol diglycidyl ether, polyglycidyl ether of phenolformaldehyde resole or novolak resin, resorcinol diglycidyl ether, and epoxy silicones, e.g., dimethylsiloxanes having cycloaliphatic epoxide or glycidyl ether groups.

Various commercial epoxy resins are available and listed in Lee and Neville *Handbook of Epoxy Resins*; McGraw Hill Book Co.: New York, 1967; Appendix A and Bruins Epoxy Resin Technology; John Wiley & Sons: New York, 1968.

In particular, cyclic ethers that are readily available include propylene oxide, epichlorohydrin, styrene oxide, cyclohexene oxide, vinylcyclohexene oxide, glycidol, glycidyl methacrylate, octylene oxide, phenyl glycidyl ether, 1,2-butane oxide, diglycidyl ether of bisphenol A, vinylcyclohexene dioxide, 3,4-epoxy-6-methylcyclohexylmethyl, 3,4-epoxy-6-methylcyclohexanecarboxylate, bis(3,4-epoxy-6-methylcyclohexylmethyl)adipate, aliphatic epoxy modified with polypropylene glycol, dipentene dioxide, epoxidized polybutadiene, silicone epoxy, 1,4-butanediol diglycidyl ether, polyglycidyl ether of phenolformaldehyde novolak, resorcinol diglycidyl ether, polyglycol diepoxide, polyacrylate epoxide, urethane modified epoxide, polyfunctional flexible epoxides, and mixtures thereof, as well as mixtures with co-curatives, curing agents, or hardeners that also are well known. Representative of the co-curatives and hardeners that can be used are acid anhydrides such as nadic methyl anhydride, cyclopentanetetracarboxylic dianhydride, pyromellitic anhydride, cis-1,2-cyclohexanedicarboxylic anhydride, Lewis acids, such as boron trifluoride, and mixtures thereof.

Polymers of the present invention may also be prepared by reaction of functional group substituted polyolefin-π-bonded metal complexes with functional group substituted preformed polymers to give modified polymers containing polyolefin-π-bonded metal groups.

In this approach, a polymer may be modified by reaction of an organometallic functional group precursor with a polymer containing at least one group capable of reacting with said organometallic functional group precursor to form an organometallic functional group. An example of this approach is the reaction of phenyl group containing polymers such as polystyrene with chromium hexacarbonyl to form benzenechromium tricarbonyl functionalized polymers. The polymers formed by this method may have organometallic functional groups pendent from the polymer backbone or incorporated directly into the polymer backbone.

Nonlimiting examples of such reactions include: hydrosilation of ethylenically unsaturated group substituted polyolefin-π-bonded metal complexes with polymers containing silicon-hydrogen bonds; addition of acid halide group substituted polyolefin-π-bonded metal complexes to polymers containing alcohol, primary amine, and secondary amine groups; addition of alcohol group substituted polyolefin-π-bonded metal complexes to polymers containing acid or ester groups.

Illustrative examples of polymers containing silicon-hydrogen bonds include hydride terminated polydimethylsiloxanes, polymethylhydrosiloxanes, methylhydrodimethylsiloxane copolymers, methylhydrophenylmethylsiloxane copolymers, methylhydromethyloctylsiloxane copolymers, and poly(1,2-dimethylsilazane).

Illustrative examples of acid halide group substituted polyolefin-π-bonded metal complexes include chloroformylcyclopentadienyltricarbonylmanganese, 2-methylchloroformylcyclopentadienyltricarbonylmanganese, 3-methylchloroformylcyclopentadienyltricarbonylmanganese, chloroformylbenzenetricarbonylchromium, and chloroformylcyclopentadienyltricarbonylrhenium.

Illustrative examples of polymers containing alcohol groups include polyethylene glycols, polypropylene glycols, hydroxyethyl cellulose, poly(butadiene)diol, poly(2-hydroxyethyl acrylate), poly(2-hydroxyethyl methacrylate), poly(hydroxypropyl methacrylate), styrene-allyl alcohol copolymers, vinyl alcohol-vinyl acetate copolymers, vinyl alcohol-vinyl butyral copolymers, vinyl chloride-vinyl acetate-vinyl alcohol terpolymers, ethylene-vinyl alcohol copolymers, poly(p-vinylphenol), (hydroxyalkylene oxide) methyldimethylsiloxane copolymers, and hydroxyethylene oxide terminated dimethylsiloxanes.

Illustrative examples of polymers containing primary or secondary amine groups include polyp-aminostyrene), styrene-p-aminostyrene copolymers, amine terminated butadiene-acrylonitrile copolymers, amine terminated poly (ethylene oxide), amine terminated poly(propylene oxide), aminopropyl terminated polydimethylsiloxanes, aminobutyl terminated polydimethylsiloxanes, and (aminopropyl) methyl-dimethylsiloxane copolymers.

Illustrative examples of acid or ester group containing polymers include butyl methacrylate-isobutyl methacrylate copolymers, ethylene-acrylic acid copolymers, poly(acrylic acid), poly(butyl acrylate), poly(butyl methacrylate), poly (ethyl acrylate), poly(ethyl methacrylate), poly(isobutyl methacrylate), poly(methyl acrylate), poly(methyl methacrylate), propyleneacrylic acid copolymers, propylene-ethylene-acrylic acid terpolymers, styrene-butyl methacrylate copolymers, poly(methacrylic acid), and styrene-methyl methacrylate copolymers.

Energy sensitive compositions of this invention are typically prepared by simply mixing an organometallic polymer or monomer (neat or in solution) with any other desired adjuvants or ingredients.

Compositions of the present invention may also include a variety of adjuvants utilized for their known purpose, such as colorants, polymeric organic diluents, stabilizers, inhibitors, lubricants, flexibilizers, carbon black, reinforcing fillers such as finely divided silica, non-reinforcing fillers such as diatomaceous earth, metal oxides, asbestos, fiberglass, glass bubbles, and talc as long as the adjuvants do not interfere with polymerization and/or subsequent energy sensitization as described herein. It is also preferred the adjuvants be transparent to the radiation used for the energy sensitization. Adjuvants are used in amounts consistent with their known functions.

Substrates may be metals that are known in the art to have basic reactive sites derived from surface oxide layers, ceramic materials, glasses that are known in the art to have basic reactive sites on their surfaces, and polymers that are known in the art to have basic reactive sites on their surfaces. Substrates may be treated with silane coupling agents and the like to provide a surface with suitable basic reactive sites.

Suitable substrates include, but are not limited to, inorganic substrates such as glass treated with alkali to produce a glass with resultant basic reactive sites, ceramics, and metals such as iron, stainless steel, copper, brass, titanium, aluminum, anodized aluminum, silicated aluminum, and alloys and metallized organic substrates such as metallized polyester. In addition to being essentially planar, suitable substrates include but are not limited to particles, fibers, filaments, and the like.

Energy sensitive compositions of the present invention are coated on substrates using techniques known to those skilled in the art and include spraying, curtain coating, direct or reverse roll coating, dipping, brushing, extruding, and printing. The coatings, however applied are allowed to dry to form an essentially solvent-free coating. Advantageously, the coatings in the absence of radiant or thermal energy, remain soluble and can be removed from the surface of the substrate by treatment with a solvent. The coatings are adhered to the surface of a substrate upon exposure to electromagnetic radiation, radiant energy, accelarated particles (electron beam), or thermal energy (infrared or heat). Adhered coatings of the invention can have a thickness ranging from about 0.3 nanometer to about $10^6$ nanometers. Preferred coating thicknesses range from about 0.5 nanometers to about 500 nanometers, and more preferably a coating thickness is in the range of about 1 to 20 nanometers.

For example, coatings on a substrate such as aluminum, having a coating thickness of about 50 nanometers provide a radiation-sensitive lithographic plate that on exposure and development give images having excellent adhesion to the substrate and allow for the printing of multiple copies. The dried coating is adhered to the substrate by exposure to a sufficient dose of actinic radiation or heat that may vary from about two seconds to twenty minutes or more depending on the thickness and particular composition of the coating.

To prepare imagewise substrates, for example, driographic plates, a substrate is coated with an energy sensitive composition of the present invention, exposed to actinic radiation in an imagewise fashion, preferably in the absence of molecular oxygen and then rinsed with an appropriate solvent to remove the unexposed energy sensitive composition.

Suitable energy for adhering the coated compositions of this invention to substrates by means of covalent bonding of metal atoms to substrate basic reactive sites include heat such as provided by ovens operating at about 50° to about 200° C. or higher, or actinic radiation. Suitable actinic radiation sources include but are not limited to, sunlight, carbon arcs, mercury-vapor arcs, tungsten lamps, xenon lamps, lasers, and fluorescent lamps. Electron accelerators and electron beam sources may also be used.

The energy sensitive compositions, particularly when coated on a substrate, provide layered structures that are useful as protective coatings, adhesive primers, durable release agents, and the like.

The energy sensitive compositions of the present invention can be used with inorganic substrates to provide an abrasive article. The abrasive article can be a bonded abrasive, a coated abrasive, or a nonwoven abrasive. In the case of a bonded abrasive, a binder serves to bond abrasive particles together to form a shaped mass, typically in the form of a wheel. In the case of a coated abrasive, the binder serves to bond abrasive particles to a backing. Typically in a coated abrasive, there is a first binder, commonly referred to as a make coat that secures abrasive particles to the backing. Over the abrasive paricles/make coat is a second binder, commonly referred to as a size coat that reinforces the abrasive particles. In the case of a nonwoven abrasive, the binder serves to bond abrasive particles into an open, porous, fibrous substrate. This type of nonwoven abrasive is further described in U.S. Pat. No. 2,958,593 and such description is incorporated herein by reference.

The size of abrasive particles are typically in range from about 0.1 to 1500 micrometers, preferably between 1 to 1300 micrometers. Nonlimiting examples of such abrasive particles include fused or calcined aluminum oxide, ceramic aluminum oxide, heat-treated aluminum oxide, silicon carbide, alumina zirconia, diamond, ceria, cubic boron nitride, boron carbide, garnet, and combinations thereof.

The binder comprises a resinous adhesive and optionally inorganic particles. Examples of typical resinous adhesives include phenolic resins, aminoplast resins, urethane resins, epoxy resins, acrylate resins, acrylated isocyanurate resins, urea-formaldehyde resins, isocyanaurate resins, acrylated urethane resins, acrylated epoxy resins, and mixtures thereof. Examples of useful inorganic particles include metal carbonates, such as calcium carbonate (chalk, calcite, marl, travertine, marble and limestone), calcium magnesium carbonate, sodium carbonate, magnesium carbonate; silica, such as quartz, glass beads, glass bubbles, and glass fibers; silicates, such as talc, clays (montmorillonite), feldspar, mica, calcium silicate, calcium metasilicate, sodium aluminosilicate, sodium silicate; metal sulfates, such as calcium sulfate, barium sulfate, sodium sulfate, aluminum sodium sulfate, aluminum sulfate; gypsum; vermiculite; wood flour; aluminum trihydrate; metal oxides, such as calcium oxide (lime), aluminum oxide, titanium oxide; metal sulfites, such as calcium sulfite; and mixtures thereof. The term inorganic particles also encompasses grinding aids.

Grinding aids are defined as particulate material that the addition of which has a significant effect on the chemical and physical processes of abrading that results in improved performance. Examples of grinding aids include sodium chloride, potassium cryolite, sodium cryolite, ammonium cryolite, potassium tetrafluoroborate, sodium tetrafluoroborate, silicon fluorides, potassium chloride, magnesium chloride, tin, lead, bismuth, cobalt, antimony, cadmium, iron, titanium, and combinations thereof. The average particle size of the inorganic particles range from between 0.01 to 30 micrometers, preferably in the range of 0.1 to 20 micrometers.

The binder may comprise by weight between 20% to 80%, preferably between 30% to 60% resinous adhesive and between 20% to 80%, preferably between 30% to 60% inorganic particles. The amounts of these materials are selected to provide the desired properties. The energy sensitive compositions of the present invention may be incorporated into the binder and subsequently reacting with abrasive particles and/or other inorganic particles, wherein the abrasive particles and/or the inorganic particles have basic reactive sites. Alternatively, the abrasive particles and/or the inorganic particles may be coated with energy sensitive compounds prior to incorporation into the binder system.

Examples of backings typically used in abrasive articles include but are not limited to polymeric film, primed polymeric film, cloth, paper, vulcanized fiber, nonwovens and treated versions thereof and combinations thereof.

Objects and advantages of this invention are further illustrated by the following examples, but the particular materials and amounts thereof recited in these examples, as well as other conditions and details, should not be construed to unduly limit this invention.

EXAMPLES

In the following examples, organometallic monomers and polymers were prepared. Infrared spectroscopy (IR) and/or proton nuclear magnetic resonance ($^1$H NMR) spectroscopy and/or mass spectroscopy were used to confirm structures of the prepared monomers and polymers. All starting materials were commercially available for example, from Aldrich Chemical Co. or prepared as indicated.

Example 1

In this example copolymers of methyl(vinyl) cyclopentadienyltricarbonylmanganese (prepared according to the method described in Kurimura et al. *Makromol. Chem.* 1982, 183, 2889) and vinyl monomers were prepared. The transition metal carbonyl modified polymers were adhered to aluminum metal by exposing the polymers to radiation.

Copolymers were prepared by free radical initiated solution polymerization according to the general procedure described in Pittman et al. *Macromolecules* 1973, 6, 1. Reaction mixtures were deoxygenated by purging the solution to be polymerized with nitrogen or carbon monoxide for at least 5 minutes prior to polymerization. Copolymerizations were carried out in the dark for at least 20 hours at 70° C. using azobis(isobutyro)nitrile (AIBN) as the initiator. Copolymers were isolated by repeatedly precipitating copolymer solutions by addition of a non-solvent such as methanol. The copolymers were dried in vacuo for several days at room temperature and their composition was determined by $^1$H NMR.

Adhesion to an aluminum substrate was tested by coating the copolymers from suitable solvents (for example, acetone, methyl ethyl ketone, or dichloromethane) onto type A aluminum Q-panels (available from Q-Panel Co., Cleveland, Ohio) and irradiating the dried coatings under a nitrogen atmosphere through a resolution mask (available from Stouffer Graphic Arts Co., South Bend, Ind.) with a Blak-Ray™ lamp (UVP, Inc., San Gabriel, Calif.) containing two 366 nm, 15 watt GE Blacklight bulbs (#F15T8-BLB, General Electric Co., Schenectady, N.Y.) for 5 minutes. The coated substrates were then rinsed with the same solvent used for coating, in order to remove the unexposed areas. The remaining coating was a negative, abrasion resistant image that was formed on the aluminum substrate, in cases where image formation was observed.

TABLE I

| Vinyl Comonomer | Reaction Solvent | Reaction Atmosphere | Mol % Mn in Polymer | Image Formation |
|---|---|---|---|---|
| methyl acrylate | toluene | $N_2$ | 18.8 | yes |
| ethyl acrylate | toluene | $N_2$ | 5.6 | yes |
| isooctyl acrylate | toluene | $N_2$ | nd | yes |
| 2-(2-ethoxyethyl)-ethyl acrylate | toluene | $N_2$ | 7.0 | yes |
| perfluorooctyl acrylate | cyclohexane | $N_2$ | 13.0 | yes |
| glycidyl methacrylate | benzene | CO | 15.5 | yes |
| glycidyl methacrylate | toluene | CO | 8.0 | yes |
| styrene | toluene | $N_2$ | 9.6 | yes |
| styrene | toluene | $N_2$ | 1.0 | yes |
| styrene (comparative) | none | none | 0.0 | no | nd = not determined

The results of Table I show that incorporation of tricarbonylmanganese containing groups allows photoinduced adhesion of polymers to metal substrates and that no adhesion is observed in the absence of these groups. Table I further shows that a wide variety of vinyl copolymers containing tricarbonylmanganese containing groups may be prepared with various amounts of these groups.

Example 2

This example illustrates a range of substrates, summarized in Table II, useful in the practice of the present invention.

Thin coatings of a styrene/methyl(vinyl) cyclopentadienyltricarbonylmanganese copolymer containing 9 mol % methyl(vinyl)

cyclopentadienyltricarbonylmanganese were solution cast as in Example 1 on various substrates. The dried coatings were irradiated and developed as described in Example 1.

TABLE II

| Substrate | Image Formation |
| --- | --- |
| Aluminum | yes |
| Silicated aluminum | yes |
| Polished aluminum | yes |
| Cold rolled steel | yes |
| Stainless steel | yes |
| Brass | yes |
| Copper | yes |
| Titanium | yes |
| Gold | no |
| Platinum | no |
| Nickel | yes |
| Silver | no |
| Tantalum | no |

The results shown in Table II indicate that metals known in the art to have basic reactive sites on their surfaces by virtue of their native oxide surfaces are useful substrates for the photoadhesion of organometallic polymers containing metal carbonyl groups. Table II further shows that metals lacking such sites do not photoadhere organometallic polymers.

Example 3

In this example an epoxy group substituted polyolefin-π-bonded metal carbonyl complex was prepared and then used as an adhesion promoter.

The glycidyl ether of methyl(α-hydroxyethyl) cyclopentadienyltricarbonylmanganese was prepared as follows: a solution was formed containing 37.0 grams of methyl(α-hydroxyethyl) cyclopentadienyltricarbonylmanganese (prepared as described in Kurimura, et. al., *Makromol. Chem.* 1982, 183, 2889) and 58 ml epichlorohydrin in 90 ml 50% aqueous sodium hydroxide. Aqueous 40% tetrabutylammonium hydroxide solution (5 ml) was added to the solution and then stirred overnight. This mixture was poured into 200 ml of cold water and washed with 3×100 ml portions of dichloromethane. The organic washes were combined, dried over anhydrous magnesium sulfate, and filtered. The filtrate was evaporated under reduced pressure at 60° C. The residue was placed under vacuum (0.1 Torr) for 5 hours and then distilled at 65–75° C. at 0.2 Torr to give 34.5 grams of methyl(α-glycidyloxyethyl)cyclopentadienyl-tricarbonylmanganese as a yellow liquid (81% yield).

In an alternative synthesis, 5.0 grams of methyl(α-hydroxyethyl)cyclopentadienyltricarbonylmanganese was dissolved in 50 ml of anhydrous ethylene glycol dimethyl ether under a nitrogen atmosphere. Sodium metal (0.55 gram) was added as several small pieces and the mixture was stirred under nitrogen for 24 hours. Epichlorohydrin (1.6 ml) was added to the red reaction mixture and the solution was stirred for an additional 4 hours. The reaction mixture was poured into ice water and the product was isolated as above.

The methyl(α-glycidyloxymethyl) cyclopentadienyltricarbonylmangaese was prepared as a 1% solution in hexanes and coated using a #8 wire-wound Mayer rod (R & D Specialties, Webster, N.Y.) onto an aluminum Q-panel substrate. The coating was air-dried for approximately 5 minutes and irradiated for about 13 minutes under nitrogen through a resolution mask as described in Example 1. A brownish colored film in the exposed areas was developed after rinsing the layered structure with hexane. Peel tests using Scotch™ Brand Magic Tape™ (3M, St. Paul, Minn.) resulted in the transfer of the adhesive from the Magic Tape™ to the image on the Q-panel. Adhesive was not transferred to unimaged areas of the Q-panel. Dusting the Q-panel with tone powder produced a well resolved black negative-tone image. Similar results were obtained when irradiation through a mask was carried out under a room air atmosphere. This example demonstrated the utility of the present invention for adherographic applications and as a primer or adhesive promoter for pressure sensitive adhesives.

Example 4

In this example, hydroxy containing polymers were modified by esterifying the polymers with organometallic acid halide derivatives.

In general, hydroxy functionalized polymers were reacted with $((CH_3C_5H_3C(=O)Cl)Mn(CO)_3)$ (a mixture of 1,2- and 1,3-isomers, prepared as described in Gowal et al. *Monatshefte für Chemie* 1968, 99, 972) in the presence of an amine base (for example, pyridine or triethylamine) in a nonreactive solvent to yield polymers with pendent $(CH_3C_5H_3C(=O)OR)Mn(CO)_3$ ester groups wherein R was the polymer backbone. Since, the reaction was essentially quantitative, the degree of organometallic group incorporation was controlled by reaction stoichiometry.

A 1.04 grams sample of a perfluoroethylene oxide diol having two repeat units of $HOCH_2CF_2O\text{-}(CF_2CF_2O)\text{-}_{20}CF_2CH_2OH$ (as described in U.S. Pat. Nos. 3,810,874, 4,085,137, and 4,094,911 and such description is incorporated herein by reference) and 0.32 gram $(CH_3C_5H_3C(=O)Cl)Mn(CO)_3$ were dissolved in 10 ml of Freon™ TF (1,1,3-trichlorotrifluoroethane, Van Waters & Rogers, San Mateo, Calif.) to give a yellow solution. Triethylamine (0.30 ml) was added and a white precipitate formed almost immediately. After the mixture was stirred for one hour the white precipitate was removed by filtration. The remaining yellow filtrate was evaporated to a viscous yellow fluid. The viscous fluid was extracted with petroleum ether to separate the desired product from any unreacted polyfluoroethylene oxide diol. Extraction produced a bright yellow petroleum ether solution and a small amount of a brownish oil that was insoluble in petroleum ether. The petroleum ether extract was evaporated to give 1.1 grams of cyclopentadienyl manganese tricarbonyl end-capped polyfluoroethylene oxide diol ester as a yellow fluid.

Polybutadiene diol, poly(p-vinylphenol), poly (vinylformal), styrene/allyl alcohol copolymer, vinyl alcohol/vinyl acetate copolymer, and polyethylene glycol were derivatized as described above, using suitable nonreactive solvents, such as chloroform, methylene chloride, and toluene.

Example 5

In this example, an organometallic diol was prepared, which was converted to a polyurethane and then adhered to aluminum.

Ten milliliters of glycerol and 9.0 grams of $(CH_3C_5H_3C(=O)Cl)Mn(CO)_3$ in 100 ml of pyridine was stirred for 2 hours. The reaction mixture was washed with water, 10% hydrochloric acid, and 1 N sodium hydroxide. The organic layer was dried over anhydrous magnesium sulfate, and filtered. The filtrate was evaporated to an oil. The oil was vacuum distilled (165° C., 0.3 Torr) to give 8.65 grams of $(CH_3C_5H_3C(=O)OCH_2CH(OH)CH_2(OH))Mn(CO)_3$ (a mixture of 1,2 and 1,3 ring substituted isomers) as a yellow resin. A 0.10 gram sample of $(CH_3C_5H_3C(=O)OCH_2CH(OH)CH_2(OH))Mn(CO)_3$ was mixed with 2.10 grams of hexanediisocyanate and 4.9 grams of polyethylene glycol (average molecular weight of 400. Two drops of a 1% dibutyltin dilaurate in 1,2-dichloroethane was added as a cure catalyst. The mixture was heated on a steam bath for 5 hours to give a polyurethane containing pendent $(CH_3C_5H_3C(=O)OR)Mn(CO)_3$ ester groups where R is the polyurethane backbone. A 10% solution of polymer in toluene was coated with a #8 wire-wound Mayer rod onto an aluminum Q-panel. The dried coating was imaged as described in Example 1. The image resulted in a mildly tacky negative image of the resolution mask with moderate abrasion resistance.

evaporated under reduced pressure. The residue was dissolved in a minimum amount of dichloromethane and the solution was filtered through silica gel to remove residual platinum catalyst. After evaporation of the dichloromethane, the residue was dried under high vacuum to give the derivatized siloxane as a yellow fluid. The derivatized siloxane could also be purified by reprecipitation from dichloromethane or chloroform solutions by the addition to large excesses of methanol or acetonitrile. The results of this procedure are shown in Table III. The hydrosilation reaction was essentially quantitative thus the degree of methyl(vinyl) cyclopentadienyltricarbonylmanganese incorporation could be controlled by stoichiometry.

TABLE III

| Siloxane[a] | Amount of Mn[f] | Amount of Catalyst[b] | Reaction Time[c] | Amount of Solvent | ν (CO)[d] | ν (SiH)[d] |
|---|---|---|---|---|---|---|
| PS129.5 (2.0 g) | 10 μl | 0.10 | 12 | 25 ml | 1922, 2012 w | 2165 s |
| PS120 (5.1 g) | 0.2 g | 0.10 | 12 | 25 ml | 1920, 2012 s | 2165 m |
| PS124.5 (2.0 g) | 0.48 g | 0.15 | 18 | 25 ml | 1925, 2015 s | none |
| PS537 (2.0 g) | 3.65 g | 0.15 | 22 | 25 ml | 1935, 2020 s | none |
| PS543 (2.0 g) | 52 μl | 0.15 | 24e | 25 ml | 1940, 2022 s | none |
| PS125.5 (2.0 g) | 24 μl | 0.10 | 20 | 25 ml | 1930, 2020 s | 2155 m |
| PS123 (2.0 g) | 0.86 ml | 0.15 | 20 | 25 ml | 1935, 2019 s | 2160 w |
| PS123.8 (2.0 g) | 74 μl | 0.15 | 17 | 25 ml | 1939, 2021 s | none |

[a]all available from Petrach Systems, Bristol, PA
[b]in milliliters
[c]in hours
[d]wavenumbers (cm$^{-1}$), w = weak, m = medium, s = strong
[e]reaction run at room temperature
[f]as methyl(vinyl)cyclopentadientyltricarbonylmanganese

Example 6

This example shows that vinylcyclopentadienyl metal complexes may be hydrosilated by small molecule hydrosiloxanes, that chloroplatinic acid $(H_2PtCl_6)$ was an effective catalyst for the hydrosilation of vinylcyclopentadienylmetalcarbonyl complexes, and that both the α and β hydrosilation products were obtained.

Vinylcyclopentadienyltricarbonylmanganese (1.0 gram, prepared according to Pittman et al. *Macromolecules* 1973, 6, 1), pentamethyldisiloxane (0.9 gram, Petrarch Systems), and chloroplatinic acid (100 μL, 0.10 molar isopropanol solution were refluxed in 25 ml heptane for 5 hours. The reaction solution was cooled and rotary evaporated to a yellowish oil. The oil was vacuum distilled to give 0.7 gram (57%) of pentamethylsiloxyethylcyclopentadienyltricarbonylmanganese, as a mixture of α and β isomers where the α:β ratio is 1:2.1.

Example 7

In this example a general procedure for preparing siloxane polymers having organometallic functionality is described.

The general procedure for preparing siloxane polymers with pendant $(CH_3C_5H_3CH_2CH_2R)Mn(CO)_3$ and $(CH_3C_5H_3CHRCH_3)Mn(CO)_3$ groups, (R is the siloxane backbone), involves admixing a silicone bearing Si—H functionality, a molar equivalency of methyl(vinyl) cyclopentadienyltricarbonylmanganese in heptane, and an effective amount of chloroplatinic acid (0.1 molar isopropanol solution), used as a hydrosilation catalyst. The mixture was refluxed for several hours then cooled, filtered, and

Example 8

In this example, an alternative general procedure for preparing siloxane polymers having organometallic functionality is described.

A general procedure for preparing siloxane polymers with pendant $CpMn(CO)_3$ was to admix 10 grams of a silicone bearing Si—H functionality, a molar equivalency of methyl (vinyl)cyclopentadienyltricarbonylmanganese in 100 ml cyclohexane, and platinumdivinyltetramethyldisiloxane (2 μL catalog #PC075, Petrarch Systems, Bristol, Pa.) hydrosilation catalyst. The mixture was refluxed for 3 hours, then cooled, filtered, and the filtrate was evaporated under reduced pressure. The residue was then placed under high vacuum to remove trace amounts of solvent and gave the derivatized siloxane as a yellow fluid. An alternative method for purifying the residue is to filter through silica gel and evaporate the solvent.

Example 9

In this example, styrene/styrenechromiumtricarbonyl copolymers were prepared, which were subsequently adhered to an aluminum substrate, the coated substrate was shown to be suitable for use in printing plate applications.

Copolymers of styrene and (styrene)chromiumtricarbonyl were prepared from polystyrene (MW 250,000) and chromium hexacarbonyl according to the method described in Pittman et al. *J. Polymer Sci., Part A-1* 1972, 10, 379. The copolymer obtained (containing 5 mole % styrenechromiumtricarbonyl) was dissolved (5% by weight) in dichloromethane and coated with a #20 wire wound Mayer rod on aluminum Q-panels. Air drying the coated substrate gave tack-free coatings, which were imaged according to the procedure described in Example 1. The resulting negative image appeared to be abrasion resistant and receptive to lithographic ink in the presence of a commercial lithographic fountain solution. Similar results were obtained when irradiation was carried out under a room air atmosphere.

Example 10

This example shows that chemical modifications can be made on transition metal centers of organometallic polymers and that these modifications changed the properties of organometallic polymers. The example further demonstrated that organometallic polymers may be ionomeric, and the polymer's adhesion to appropriate substrates may be accomplished either photochemically or thermally.

One gram of a styrene/methyl(vinyl) cyclopentadienyltricarbonylmanganese copolymer containing 10 mole % manganese (prepared as described in Example 1) was dissolved in 40 ml of dry, oxygen-free dichloromethane under a nitrogen atmosphere. The solution was cooled to 0° C. and 0.1 gram of nitrosonium tetrafluoroborate was added. After stirring for 2 hours, the solution was evaporated to give a viscous yellow-orange tar. The tar was dissolved in a minimum of dichloromethane. The resulting polymer was reprecipitated by adding the dichloromethane solution dropwise to excess methanol while stirring. The resulting pale yellow powder was collected by filtration and washed with hexanes and ether to yield the styrene/$(CH_3C_5H_3CH=CH_2)Mn(CO)_2(NO)^+BF_4^-$ copolymer as a yellow solid.

Thin coatings of the copolymer were cast on aluminum Q-panels and type QD steel Q-panels (the Q-Panel Co.) from methyl ethyl ketone solutions. A coated aluminum panel was irradiated as described in Example 1 to form the negative image of a resolution mask. The resultant image was moderately abrasion resistant. Coated, unexposed steel and aluminum panels were placed in a darkened 100° C. oven for 18 hours. After cooling, both panels had adherent polymer films, which could not be removed by solvent rinses. These coatings showed moderate abrasion resistance.

Example 11

In this example (arene)$Cr(CO)_3$ functionalized polysiloxanes were prepared and subsequently adhered to a metal substrate by exposure to actinic radiation.

Chromium hexacarbonyl (0.1 gram) and 4.0 ml of methylhydrophenylmethylsiloxane copolymer (PS129.5, Petrarch Systems, Bristol, Pa.) were reacted according to the procedure described in Example 9 to give methylhydrophenylmethyl-methyl(phenylchromium tricarbonyl)siloxane terpolymer as a viscous yellow fluid.

Chromium hexacarbonyl (0.5 gram) and 2.0 grams of polyphenylmethylsiloxane (PS160, Petrarch Systems, Bristol, Pa.) were reacted according to the procedure described in Example 9 to give phenylmethylmethyl (phenylchromium tricarbonyl)siloxane copolymer as a viscous yellow fluid.

The phenylmethyl-methyl(phenylchromium tricarbonyl) siloxane copolymer was coated on aluminum Q-panels and silicated aluminum printing plate stock (Viking brand, 3M Co., St. Paul, Minn.) by wiping the undiluted fluid onto the substrates with a lint free tissue. The coated samples were irradiated through a resolution guide for approximately ten minutes as described in Example 1. After rinsing the exposed samples with dichloromethane and acetone, a negative, hydrophobic image of the resolution guide was obtained.

Examples 12–17

In these examples, manganese functionalized siloxanes and fluorocarbons were used as durable release coatings.

Manganese functionalized siloxanes were prepared as described in Example 7. The functionalized siloxanes were coated from hexanes containing 1% by weight polymer onto aluminum Q-panels using a #10 wire wound Mayer rod. Manganese functionalized polyfluoroethylene oxide diol as described in Example 4 was coated on aluminum Q-panels from Freon™ TF in the same manner as the siloxanes. The coated panels were irradiated at a distance of ½ for 2 minutes with two 15 watt fluorescent blacklights. The panels were then rinsed with hexanes or Freon™ TF to remove any unadhered polymer. The panels were evaluated in 180° peel tests at 6 in/min. using Scotch™ brand Magic Tape™, Macdermid silicone pressure sensitive tape PSA) tape (MacDermid, Inc., Waterbury, Conn.) and a Instrumentors slip/peel tester model SP-102B-3M90 (Instrumentors, Inc., Strongville, Ohio). The results are summarized in Table IV. The panels were first tested with Scotch™ brand Magic Tape™ and then with Macdermid tape (Table IV, initial peels columns). This was followed by 20 repeated peels with Macdermid tape and re-evaluation with Scotch™ brand Magic Tape™ (Table IV, retest peels column). All peels test were performed on the same area of the test panel.

These Examples demonstrated that the Mn functionalized siloxane and fluorocarbon polymers behave as durable release coatings. The MacDermid tape is a silicon-based PSA designed to adhere to low energy surfaces such as silicone release coatings. The initial peel columns in Table IV show that this tape adhered to the silicone coating almost as well as to bare metal. On the other hand, the Scotch™ brand Magic Tape™ does not adhere well to the silicone coating. The 20 repeated peels with MacDermid tape did not remove the silicone release coating via transfer to the silicone PSA tape as the retest results show the adhesion of the Scotch™ brand Magic Tape™ did not rise significantly. A lower limit for the forces bonding the release coatings to the aluminum plate through the Mn groups may be placed at approximately 30 oz/in.

TABLE IV

| Example No. | Polymer Coating | Initial Peels[a] Scotch ™ | Initial Peels[a] Macdermid ™ | Retest Peels[a] Scotch ™ |
|---|---|---|---|---|
| comparative | none | 35 | 35 | 18 |
| 12 | PS120 (1% Mn)[b] | 1.4 | 22 | 7.1 |
| 13 | PS120 (10% Mn) | 3.6 | 26 | 6.5 |
| 14 | PS125.5 (5% Mn) | 2.0 | 30 | 6.8 |
| 15 | PS123 (50% Mn) | 4.9 | 26 | 5.1 |
| 16 | PS123 (5% Mn) | 2.0 | 28 | 7.1 |
| 17 | polyfluoroethylene oxide diol | c | c | c |

[a]peels reported in oz./in.
[b]PS# refers to siloxane from Petrach and (% Mn) refers to percentage of Si—H bonds hydrosilated with Mn complex
[c]adhesion too low to measure

Example 18

In this example manganese functionalized siloxanes and fluorocarbons were used in photoimageable printing plate constructions that may be used to print particulates.

Manganese derviatized PS120, PS124.5, PS543, PS123 and PS123.8 from Example 7, hydride endcapped polydimethylsiloxlane of average MX 1,925 (prepared as in Example 26), and polyfluoroethylene oxide diol (as described in Example 4) were coated on silicated aluminum printing plate stock (Viking™ brand printing plates, 3M Co., St. Paul, Minn.) by wiping the neat polymer onto the plate with a lint free paper tissue. The plates were exposed through a resolution guide (Stouffer Chemical) held in contact with the printing plate by a quartz plate clamped to the top of the printing plate construction. The plates were exposed with two 15 watt fluorescent blacklight lamps (GE) from a distance of one inch for a period of one to twenty minutes. The plates were then developed by rinsing with appropriate solvents, such as acetone, methyl ethyl ketone, Freon™ TF to reveal a negative image of the resolution guide. The image was hydrophobic and only the unexposed portions of the plate were wetted by distilled water. When treated with glass beads of 50–80 micrometers diameter (63 micrometers diameter average) with a refractive index of 1.93 and a density of 3.7 grams/cm$^3$ or glass bubbles (Scotchlite™ S60/10000, 3M, St. Paul, Minn.), the irradiated plates held the particulates to the imaged portions of the plate but not to the unexposed (bare metal) areas. The particulates were not readily disloged by a solvent rinse or jets of compressed air or nitrogen. The particulates were readily transfered to adhesive tape (such as Magic Tape™ or Scotch™ 33 vinyl plastic electrical tape, both available from 3M Co., St. Paul, Minn.) or rubber rollers such as those used in offset printing. Plates, which had particulates similarly removed, reformed the resolution guide image in glass beads or bubbles when placed in contact with the particulates. This cycle could be repeated several times. This demonstrated that the Mn/siloxane and Mn/fluoropolymer compositions could be photoimaged on substrates with basic sites on their surfaces and the resulting imaged substrates are useful as printing plates for particulates.

Example 19

In this example organometallic complexes bearing epoxy functionality were copolymerized with organic epoxy compounds to form poly ethers with pendent organometallic groups.

Methyl(α-glycidyloxyethyl) cyclopentadienyltricarbonylmanganese (0.5 gram) and phenylglycidylether (5.0 grams,) were mixed in a glass vial. One drop of a methanol solution of BF$_3$ was added and the mixture was stirred with a stirring rod. An exothermic reaction ensued that warmed the mixture and the viscosity increased. Drops of BF$_3$ solution were periodically added with stirring (ten drops total) until the mixture became a fused mass. The polymeric mass was dissolved in a minimum amount of dichloromethane and reprecipitated by dropwise addition to an excess of methanol. This was repeated once more and the resulting pale yellow resin was collected by decantation and dried under high vacuum.

Methyl(α-glycidyloxyethyl)cyclopentadienyl tricarbonylmanganese (0.5 gram) and cyclohexene oxide (5.0 grams) were copolymerized used the above method to give the corresponding copolymer as a pale yellow glassy solid. This example demonstrates the preparation of methyl(α-glycidyloxyethyl)cyclopentadienyl-tricarbonyl/glycidyl ether copolymer and methyl(α-glycidyloxyethyl)-cyclopentadienyl-tricarbonyl/cycloaliphatic epoxy copolymer.

Example 20

In this example acrylate monomers derived from cyclopentadienyltricarbonylmanganese complexes were prepared.

Acryloyl chloride (9 grams), methyl(α-hydroxyethyl) cyclopentadienyltricarbonylmanganese (13.1 grams), and triethylamine (10.1 grams) were dissolved in 200 ml dichloromethane under a nitrogen atmosphere. A 0.1 gram sample of N,N-dimethylaminopyridine (DMAP) was added as a catalyst. For 4 days the solution was stirred and protected from light while and a white precipitate slowly formed. The reaction mixture was extracted twice with dilute HCl and the dichloromethane phase was dried with magnesium sulfate. The magnesium sulfate was removed by filtration and the dichloromethane solution was filtered through silica gel to remove a colored impurity. The solution was then rotary evaporated to a yellowish oil that was vacuum dried to give 16.2 g (97%) of methyl(α-acryloylethyl) cyclopentadienyltricarbonylmanganese as a mixture of 1,2 and 1,3 isomers.

Example 21

In this example manganese functionalized siloxanes were used in photoimageable printing plate constructions that may be used to print ink images.

The manganese-derivatized PS120 siloxane described in Example 7 was coated onto silicated aluminum printing plate stock, exposed, and developed as described in Example 18. Stamp pad ink (Sanford black No. 58701, Sanford Corp., Bellwood, Ill.) was applied to the plate by wiping with an ink-soaked Kimwipe™ paper tissue. The exposed areas of the plate repelled the ink and the unexposed areas accepted the ink to give a positive image of the exposure mask. The image was transferred with some loss of resolution to a paper sheet by pressing the paper sheet against the inked plate.

A second plate was developed as above. Black lithographic ink was applied to the plate with a hand-held rubber roller. The ink preferentially adhered to the unexposed portions of the plate to give a positive image of the exposure mask.

Examples 22–25

In this example a monomeric epoxy manganese compound was applied to particulate matter and shown to be an effective coupling agent in a coated abrasive construction.

The glycidyl ether of methyl(α-hydroxyethyl) cyclopentadienylmanganesetricarbonyl was prepared as in Example 3. A dispersion of 100 grams of WA3000 4μ Al$_2$O$_3$ (Fujimi, Nagoya, Japan) and 0.25 gram of methyl(α-glycidyloxyethyl)cyclopentadienylmanganesetricarbonyl in 100 grams of methyl ethyl ketone was stirred for approximately 30 minutes. The excess solution was decanted and the remaining residue was air-dried while mixing to give a dry powder. The dry powder was then irradiated with a Blak-Ray™ lamp for four (4) hours. The treated mineral acquired a slight brown tint during the irradiation. Calcium carbonate (85 grams) was treated with 0.32 gram of methyl (α-glycidyloxyethyl)-cyclopentadienylmanganesetricarbonyl by the same procedure. Resin slurries were prepared with both treated and untreated mineral using the following proportions:

TABLE V

| Slurry 22* | Slurry 23 | Slurry 24 | Slurry 25 |
| --- | --- | --- | --- |
| 22.28 grams 70/30 mixture of | 22.28 grams 70/30 mixture of | 22.28 grams resole phenolic | 22.28 grams resole phenolic |

TABLE V-continued

| Slurry 22* | Slurry 23 | Slurry 24 | Slurry 25 |
|---|---|---|---|
| Epon ™ 828 and Versamid ™ 125 epoxy resin 72.62 grams Mn-treated $Al_2O_3$ | Epon ™ 828 and Versamid ™ 125 epoxy resin 72.62 grams untreated $Al_2O_3$ | resin 72.62 grams Mn-treated $CaCO_3$ | resin 72.62 grams untreated $CaCO_3$ |
| 15.86 grams Poly Solve PM ™ | 15.86 grams Poly Solve PM ™ | 15.86 grams Poly Solve PM ™ | 15.86 grams Poly Solve PM ™ |

*Epon 828 is an epoxy resin available from Shell Chemical, Houston, TX; Versamid 125 is a polyamide curing agent (for epoxy) and is available from Henkel Corp., LaGrange, IL; and Poly Solve is a glycol ether solvent available from Olin Chemical, Stamford, CT.

Each slurry was knife-coated onto 3 mil ethylene acrylic acid (EAA) primed polyester film using a 4 mil knife gap. The coatings were air-dried for 15 minutes and cured at 110° C. for 4 hours to produces Examples 22 and 23, and 10 hours to produce Examples 24 and 25. The samples were evaluated by a dry Tabor Abrader test using a f22 wheel, 100 gram load, vacuum dust collection, and 1000 cycles per interval. The samples were tested alternately and weighed after each interval to determine the amount of mineral lost from the sample. The results are summarized in Table VI.

TABLE VI

| Interval | Example 22 Loss (Total) | Example 23 Loss (Total) | Example 24 Loss (Total) | Example 25 Loss (Total) |
|---|---|---|---|---|
| 1 | 0.0289 (0.0289) | 0.0332 (0.0332) | 0.0092 (0.0092) | 0.1300 (0.1300) |
| 2 | 0.0030 (0.0319) | 0.0171 (0.0503) | — | — |
| 3 | 0.0048 (0.0367) | 0.0172 (0.0675) | — | — |
| 4 | 0.0036 (0.0403) | 0.0106 (0.0781) | — | — |

Comparison of Examples 22 and 23 show the use of untreated alumina led to 94% more weight loss after 4 intervals than when the Mn-treated alumina was used. Example 25 lost 0.13 grams and eroded to the film backing in less than one interval, while Example 24 lost only 0.0092 gram in one interval.

Example 26

Polydimethylsiloxane (10.0 grams) encapped with hydride groups (weight average MW=36,764 g/mole), and prepared by copolymerization of tetramethyldisiloxane and dimethyoxydimethylsilane with anhydrous sulfuric acid according to the general procedures described in U.S. Pat. Nos. 3,344,111, and 3,436,366 and such description is incorporated herein by reference were hydrosilated with methyl(vinyl)cyclopentadienyltricarbonymanganese and purified according to the procedure of Example 8. The resulting end-capped polysiloxane was coated from cyclohexane solutions onto aluminum Q-panels (Q-panel Co., Cleveland, Ohio) that had been etched in 0.1 N sodium hydroxide for 1 minute then rinsed with deionized water. Following irradiation at a distance of approximately ½ using two 15 Watt GE F15T8-BLB bulbs (365 nm output) the coated samples were rinsed with hexanes. Peel testing measurements were made on an Instrumentors SP-102B-3M90 Slip/Peel Tester, using a 180° peel at 90 inch/minute with MacDermid P3 silicone tape (Waterbury, Conn.). The peel values reported in Table VII are in oz./in. The results are summarized in Table VII.

TABLE VII

Peel Values for Siloxane Coatings

| Coating Weight in Cyclohexane | Irradiation Time | | |
|---|---|---|---|
| | 1 Minute | 3 Minutes | 5 Minutes |
| 10 | 24.4 | 23.5 | 24.1 |
| 5 | 21.3 | 21.2 | 20.8 |
| 3 | 19.9 | 21.7 | 21.0 |
| 1 | 25.5 | 25.4 | 20.0 |
| 0.5 | 28.5 | 23.7 | 12.1 |
| 0.1 | 27.1 | 22.8 | 24.5 |
| 0 | 29.1 | 29.1 | 29.1 |

Example 27

A sample of methycyclopentadienylmanganese (dicarbonyl)pyridine was prepared by photolysis of methylcyclopentadienylmanganesetricarbonyl in the presence of excess pyridine in isooctane solvent according to Giordano and Wrighton *Inorg. Chem.* 1977, 16, 160. The red-orange reaction mixture was evaporated to a reddish oil. The oil was placed on a preparative aluminum oxide TLC plate which was developed using hexane as the eluting solvent. A fast-moving pale yellow band developed and was followed by a slower moving orange band. The two bands were collected by removing the aluminum oxide support from the glass TLC plate. The two portions of aluminum oxide were extracted with $CH_2Cl_2$ and the extracts were assayed by IR spectrophotometry. By comparison of the IR spectra to those reported by Giordano and Wrighton, the fast moving pale yellow band corresponded with unreacted methylcyclopentadienylmanganesetricarbonyl and the slower moving orange band contained methylcyclopentadienylmanganese (dicarbonyl)pyridine.

Chromatography on, or filtration through, chromatography supports such as aluminum oxide, silica gel, and magnesium silicate is a standard technique in the isolation and purification of organometallic compounds. These supports may have oxide surface groups (basic reactive sites) and thus are substrates of the present invention. Since methylcyclopentadienylmanganese(dicarbonyl)pyridine moves on aluminum oxide TLC plates without streaking and is readily and completely removed from the aluminum oxide by extraction with $CH_2Cl_2$, the class of compounds described in U.S. Pat. No. 4,503,140 do not bond to surfaces in the manner of the present invention. The compounds described in U.S. Pat. No. 4,503,140 are generated in situ by photolysis of cyclopentadienylmanganesetricarbonyl derivatives in a local excess of nucleophilic groups, such as pyridine derivatives, which further diminishes the likelihood of interactions of the organometallic group with the substrate surface.

Various modifications and alterations of this invention will become apparent to those skilled in the art without departing from the scope and spirit of this invention, and it should be understood that this invention is not to be unduly limited to the illustrative embodiments set forth herein.

We claim:

1. An energy sensitive article comprising
   (a) a substrate having basic reactive sites; and
   (b) an energy sensitive organometallic compound comprising a reaction product having at least one organometallic group produced by reacting a chloroformyl-cyclopolyenyl metal carbonyl complex with a hydroxy containing organic polymer in the presence of base coated on at least a portion of at least one surface of the substrate, wherein the organometallic compound is essentially free of reactive nucleophilic groups and is chemically bonded through the organometallic group of the organometallic compound to the basic reactive site on the substrate as a result of the application of energy.

2. The article according to claim 1, wherein the substrate is selected from the group consisting of metals with surface oxides, ceramic materials, glasses with basic reactive sites, and polymers with basic reactive sites.

3. The article according to claim 2, wherein the substrate is aluminum, anodized aluminum, silicated aluminum, calcium carbonate, alumina, nickel, steel, brass, glass, copper, or titanium.

4. The article according to claim 2, wherein the substrate is essentially planar, or geometric, such that a geometric substrate is a particle, fiber, or a filament.

5. The article according to claim 1, wherein the adhesion of the organometallic compound is imagewise.

6. An article comprising:
  (a) an abrasive particle having basic reactive sites; and
  (b) an organometallic monomer having at least one organometallic group coated on at least a portion of at least one surface of the particle, wherein the organometallic compound is essentially free of reactive nucleophilic groups and is chemically bonded through the organometallic group of the organometallic compound to the basic reactive site on the substrate as a result of the application energy.

7. The article according to claim 6, wherein the organometallic monomer is an epoxy group substituted cyclopolyenyl metal complex.

8. The article according to claim 6, wherein the particle is alumina and the energy sensitive organometallic compound is an epoxy monomer.

9. An article comprising
  (a) a substrate having basic reactive sites; and
  (b) an energy sensitive organometallic compound comprising methyl($\alpha$-glycidyloxymethyl)-cyclopentadienylmanganese tricarbonyl or methyl(($\alpha$-glycidyloxymethyl)methyl-cyclopentadienylmanganese tricarbonyl coated on at least a portion of at least one surface of the substrate, wherein the organometallic compound is essentially free of reactive nucleophilic groups and is chemically bonded through the organometallic group of the organometallic compound to the basic reactive site on the substrate as a result of the application of energy.

10. The article according to claim 9, wherein the substrate is selected from the group consisting of metals with surface oxides, ceramic materials, glasses with basic reactive sites, and polymers with basic reactive sites.

11. The article according to claim 10, wherein the substrate is essentially planar, or geometric, such that a geometric substrate is a particle, fiber or a filament.

12. The according to claim 9, wherein the adhesion of the organometallic compound is imagewise.

13. A driographic printing plate comprising a substrate having basic reactive sites and an organometallic polymer according to claim 1 coated onto and chemically bonded to the substrate at the basic reactive sites in an imagewise fashion.

14. A method for preparing an energy sensitive article comprising the steps:
  (a) coating a substrate having basic reactive sites with an energy sensitive organometallic compound comprising a reaction product having at least one organometallic group produced by reacting a chloroformylcyclopolyenyl metal carbonyl complex with a hydroxy containing organic polymer in the presence of base on at least one portion of at least one surface of the substrate, wherein the organometallic compound is essentially free of reactive nucleophilic groups; and
  (b) chemically bonding the energy sensitive organometallic compound to the basic reactive sites of the substrate by exposing the coating to energy.

15. A method for preparing an energy sensitive article comprising the steps:
  (a) coating a substrate having basic reactive sites with an energy sensitive organometallic compound comprising a reaction product having at least one organometallic group produced by reacting a chloroformylcyclopolyenyl metal carbonyl complex with a hydroxy containing organic polymer in the presence of base on at least one portion of at least one surface of the substrate, wherein the organometallic compound is essentially free of reactive nucleophilic groups; and
  (b) chemically bonding the energy sensitive organometallic compound to the basic reactive sites of the substrate by exposing the coating to energy in an inert atmosphere.

16. A driographic printing plate comprising a substrate having basic reactive sites and an organometallic polymer according to claim 9 coated onto and chemically bonded to the substrate at the basic reactive sites in an imagewise fashion.

17. A method for preparing an energy sensitive article comprising the steps:
  (a) coating a substrate having basic reactive sites with an energy sensitive organometallic compound comprising methyl($\alpha$-glycidyloxymethyl)-cyclopentadienylmanganese tricarbonyl or methyl(($\alpha$-glycidyloxymethyl)methyl-cyclopentadienylmanganese tricarbonyl on at least one portion of at least one surface of the substrate, wherein the organometallic compound is essentially free of reactive nucleophilic groups; and
  (b) chemically bonding the energy sensitive organometallic compound to the basic reactive sites of the substrate by exposing the coating to energy.

18. A method for preparing an energy sensitive article comprising the steps:
  (a) coating a substrate having basic reactive sites with an energy sensitive organometallic compound comprising methyl($\alpha$-glycidyloxymethyl)-cyclopentadienylmanganese tricarbonyl or methyl(($\alpha$-glycidyloxymethyl)methyl-cyclopentadienylmanganese tricarbonyl on at least one portion of at least one surface of the substrate, wherein the organometallic compound is essentially free of reactive nucleophilic groups; and
  (b) chemically bonding the energy sensitive organometallic compound to the basic reactive sites of the substrate by exposing the coating to energy in an inert atmosphere.

19. A method for preparing an energy sensitive article comprising the steps:
  (a) coating an abrasive particle having basic reactive sites with an energy sensitive organometallic monomer having at least one organometallic group on at least one portion of at least one surface of the abrasive particle, wherein the organometallic monomer is essentially free of reactive nucleophilic groups; and (b) chemically bonding the energy sensitive organometallic monomer to the basic reactive sites of the abrasive particle by exposing the coating to energy.

20. A method for preparing an energy sensitive article comprising the steps:

(a) coating an abrasive particle having basic reactive sites with an energy sensitive organometallic monomer having at least one organometallic group on at least one portion of at least one surface of the abrasive particle, wherein the organometallic monomer is essentially free of reactive nucleophilic groups; and (b) chemically bonding the energy sensitive organometallic monomer to the basic reactive sites of the abrasive particle by exposing the coating to energy in an inert atmosphere.

* * * * *

UNITED STATES PATENT AND TRADEMARK OFFICE
CERTIFICATE OF CORRECTION

PATENT NO. : 6,217,984 B1
DATED : April 17, 2001
INVENTOR(S) : Bruxvoort et al.

It is certified that error appears in the above-identified patent and that said Letters Patent is hereby corrected as shown below:

Column 11,
Line 13, "polyp-aminostyrene)" should read -- poly(p-aminostyrene) --.

Column 24,
Line 64, after "An" please delete "energy sensitive".

Column 25,
Line 43, after "an" please delete "energy sensitive".

Signed and Sealed this

Fourteenth Day of May, 2002

*Attest:*

*Attesting Officer*

JAMES E. ROGAN
*Director of the United States Patent and Trademark Office*